(12) United States Patent
Liaw

(10) Patent No.: US 10,854,278 B2
(45) Date of Patent: *Dec. 1, 2020

(54) SRAM STRUCTURE WITH REDUCED CAPACITANCE AND RESISTANCE

(71) Applicant: Taiwan Semiconductor Manufacturing Company, Ltd., Hsinchu (TW)

(72) Inventor: Jhon Jhy Liaw, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/600,000

(22) Filed: Oct. 11, 2019

(65) Prior Publication Data

US 2020/0043546 A1  Feb. 6, 2020

Related U.S. Application Data

(63) Continuation of application No. 16/210,412, filed on Dec. 5, 2018, now Pat. No. 10,490,261, which is a continuation of application No. 15/641,013, filed on Jul. 3, 2017, now Pat. No. 10,163,488, which is a continuation of application No. 15/047,927, filed on Feb. 19, 2016, now Pat. No. 9,704,564.

(60) Provisional application No. 62/260,858, filed on Nov. 30, 2015.

(51) Int. Cl.
| G11C 11/412 | (2006.01) |
| H01L 27/02 | (2006.01) |
| H01L 27/11 | (2006.01) |

(52) U.S. Cl.
CPC ........ G11C 11/412 (2013.01); H01L 27/0207 (2013.01); H01L 27/1104 (2013.01)

(58) Field of Classification Search
CPC .............. G11C 11/412; H01L 27/1104; H01L 27/0207

See application file for complete search history.

(56) References Cited

U.S. PATENT DOCUMENTS

| 7,269,056 B1 | 9/2007 | Liaw |
| 8,605,523 B2 | 12/2013 | Tao et al. |
| 8,630,132 B2 | 1/2014 | Cheng et al. |
| 8,760,948 B2 | 6/2014 | Tao et al. |
| 9,704,564 B2 | 7/2017 | Liaw |
| 10,163,488 B2 | 12/2018 | Liaw |

(Continued)

FOREIGN PATENT DOCUMENTS

TW  201342535 A  10/2016

*Primary Examiner* — Fernando L Toledo
*Assistant Examiner* — Neil R Prasad
(74) *Attorney, Agent, or Firm* — Slater Matsil, LLP

(57) ABSTRACT

A structure includes an SRAM cell includes a first and a second pull-up MOS device, and a first and a second pull-down MOS device forming cross-latched inverters with the first pull-up MOS device and the second pull-up MOS device. A first metal layer is over the gate electrodes of the MOS devices in the SRAM cell. The structure further includes a first metal layer, and a CVss landing pad, wherein the CVss landing pad has a portion in the SRAM cell. The CVss landing pas is in a second metal layer over the first metal layer. A word-line is in the second metal layer. A CVss line is in a third metal layer over the second metal layer. The CVss line is electrically coupled to the CVss landing pad.

20 Claims, 11 Drawing Sheets

(56) References Cited

U.S. PATENT DOCUMENTS

| | | |
|---|---|---|
| 2013/0163312 A1 | 6/2013 | Chang |
| 2013/0258759 A1 | 10/2013 | Liaw |
| 2014/0032871 A1 | 1/2014 | Hsu et al. |
| 2014/0153321 A1 | 6/2014 | Liaw |
| 2014/0153345 A1 | 6/2014 | Kim et al. |
| 2014/0177352 A1 | 6/2014 | Lum |
| 2014/0233330 A1 | 8/2014 | Ko et al. |
| 2014/0241077 A1 | 8/2014 | Katoch et al. |
| 2014/0269114 A1 | 9/2014 | Yang et al. |

SRAM STRUCTURE WITH REDUCED CAPACITANCE AND RESISTANCE

PRIORITY CLAIM AND CROSS-REFERENCE

This application is a continuation of U.S. patent application Ser. No. 16/210,412, entitled "SRAM Structure with Reduced Capacitance and Resistance," filed on Dec. 5, 2018, which is a continuation of U.S. patent application Ser. No. 15/641,013, entitled "SRAM Structure with Reduced Capacitance and Resistance," filed on Jul. 3, 2017, now U.S. Pat. No. 10,163,488 issued Dec. 25, 2018, which is a continuation of U.S. patent application Ser. No. 15/047,927, entitled "SRAM Structure with Reduced Capacitance and Resistance," filed on Feb. 19, 2016, now U.S. Pat. No. 9,704,564 issued Jul. 11, 2017, which application claims the benefit of the following provisionally filed U.S. Provisional Application No. 62/260,858, filed Nov. 30, 2015, and entitled "High Speed Cell Structure," which applications are hereby incorporated herein by reference.

BACKGROUND

Static Random Access Memory (SRAM) is commonly used in integrated circuits. SRAM cells have the advantageous feature of holding data without a need for refreshing. With the increasing demanding requirement to the speed of integrated circuits, the read speed and write speed of SRAM cells also become more important. With the increasingly down-scaling of the already very small SRAM cells, however, such request is difficult to achieve. For example, the sheet resistance of metal lines, which form the word-lines and bit-lines of SRAM cells, becomes increasingly higher, and hence the RC delay of the word-lines and bit-lines of SRAM cells is increased, preventing the improvement in the read speed and write speed.

When entering into nanometer era, split-word-line SRAM cells have become increasingly popular due to their lithography-friendly layout shapes of active regions, polysilicon lines, and metal layers, and also due to shorter bit-lines for speed improvement. However, in the nanometer era, SRAM cells are also larger, resulting in two problems. Firstly, each bit-line has to be connected to more rows of SRAM cells, which induces higher bit-line metal coupling capacitance, and hence the differential speed of the differential bit-lines (bit-line and bit-line bar) is reduced. Secondly, each word-line also has to be connected to more columns of SRAM cells, resulting in longer word-lines and hence worsened resistance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
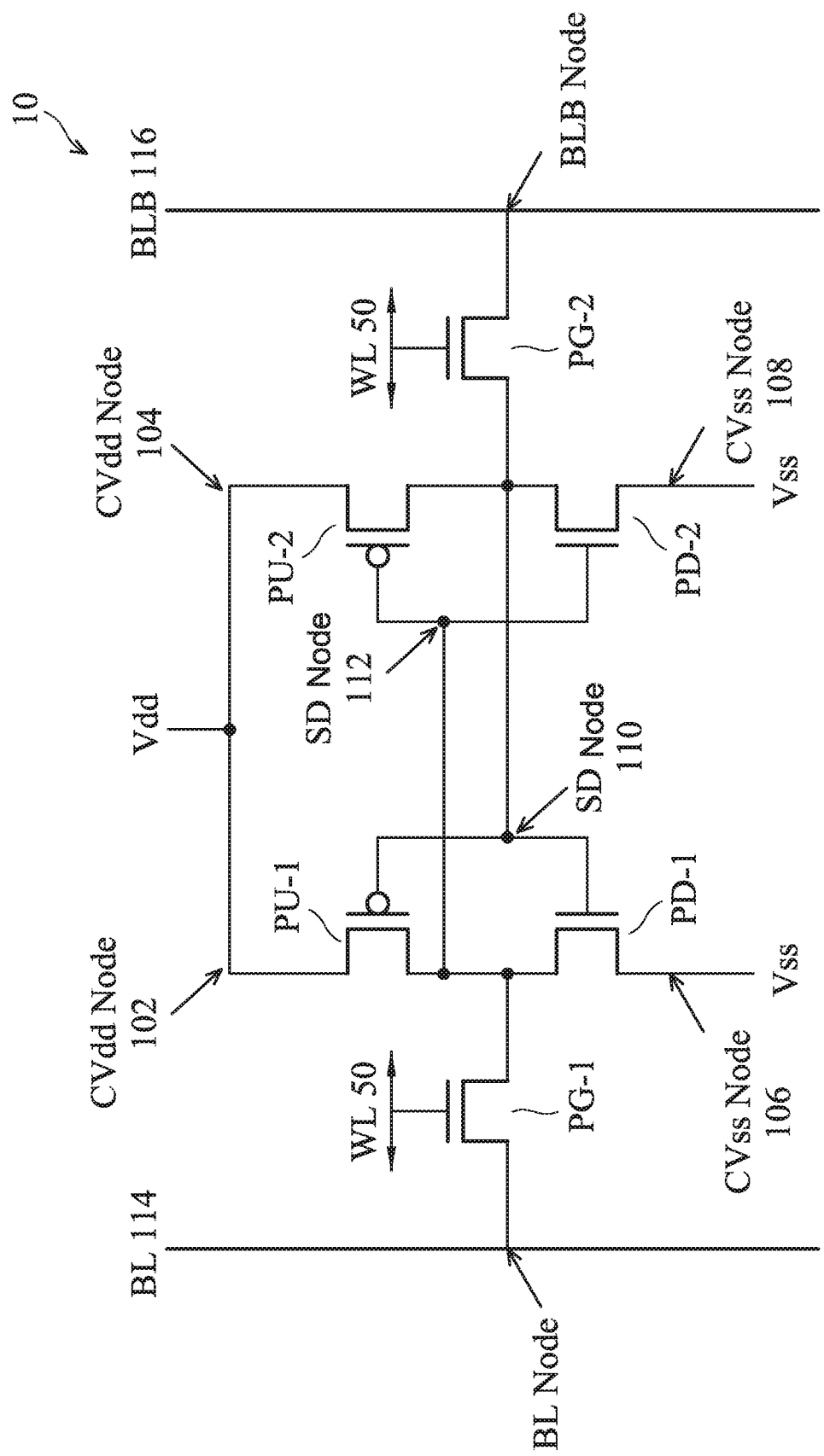
FIGS. 1 and 2 illustrate circuit diagrams of a Static Random Access Memory (SRAM) cell in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Static Random Access Memory (SRAM) cell and the corresponding SRAM array are provided in accordance with various exemplary embodiments. Some variations of some embodiments are discussed. Throughout the various views and illustrative embodiments, like reference numbers are used to designate like elements.

FIG. 1 illustrates a circuit diagram of SRAM cell 10 in accordance with some embodiments. SRAM cell 10 includes pull-up transistors PU-1 and PU-2, which are P-type Metal-Oxide-Semiconductor (PMOS) transistors, and pull-down transistors PD-1 and PD-2 and pass-gate transistors PG-1 and PG-2, which are N-type Metal-Oxide-Semiconductor (NMOS) transistors. The gates of pass-gate transistors PG-1 and PG-2 are controlled by word-line WL that determines whether SRAM cell 10 is selected or not. A latch formed of pull-up transistors PU-1 and PU-2 and pull-down transistors PD-1 and PD-2 stores a bit, wherein the complementary values of the bit are stored in Storage Date (SD) node 110 and SD node 112. The stored bit can be written into, or read from, SRAM cell 10 through complementary bit lines including bit-line (BL) 114 and bit-line bar (BLB) 116. SRAM cell 10 is powered through a positive power supply node Vdd that has a positive power supply voltage (also denoted as VDD). SRAM cell 10 is also connected to power supply voltage VSS (also denoted as Vss), which may be an electrical ground. Transistors PU-1 and PD-1 form a first inverter. Transistors PU-2 and PD-2 form a second inverter. The input of the first inverter is connected to transistor PG-1 and the output of the second inverter. The output of the first inverter is connected to transistor PG-2 and the input of the second inverter.

The sources of pull-up transistors PU-1 and PU-2 are connected to CVdd node 102 and CVdd node 104, respectively, which are further connected to power supply voltage (and line) Vdd. The sources pull-down transistors PD-1 and PD-2 are connected to CVss node 106 and CVss node 108, respectively, which are further connected to power supply voltage/line Vss. The gates of transistors PU-1 and PD-1 are connected to the drains of transistors PU-2 and PD-2, which form a connection node that is referred to as SD node 110. The gates of transistors PU-2 and PD-2 are connected to the drains of transistors PU-1 and PD-1, which connection node is referred to as SD node 112. A source/drain region of pass-gate transistor PG-1 is connected to bit line BL 114 at a BL node. A source/drain region of pass-gate transistor PG-2 is connected to bit line BLB 116 at a BLB node.

Figure 2:
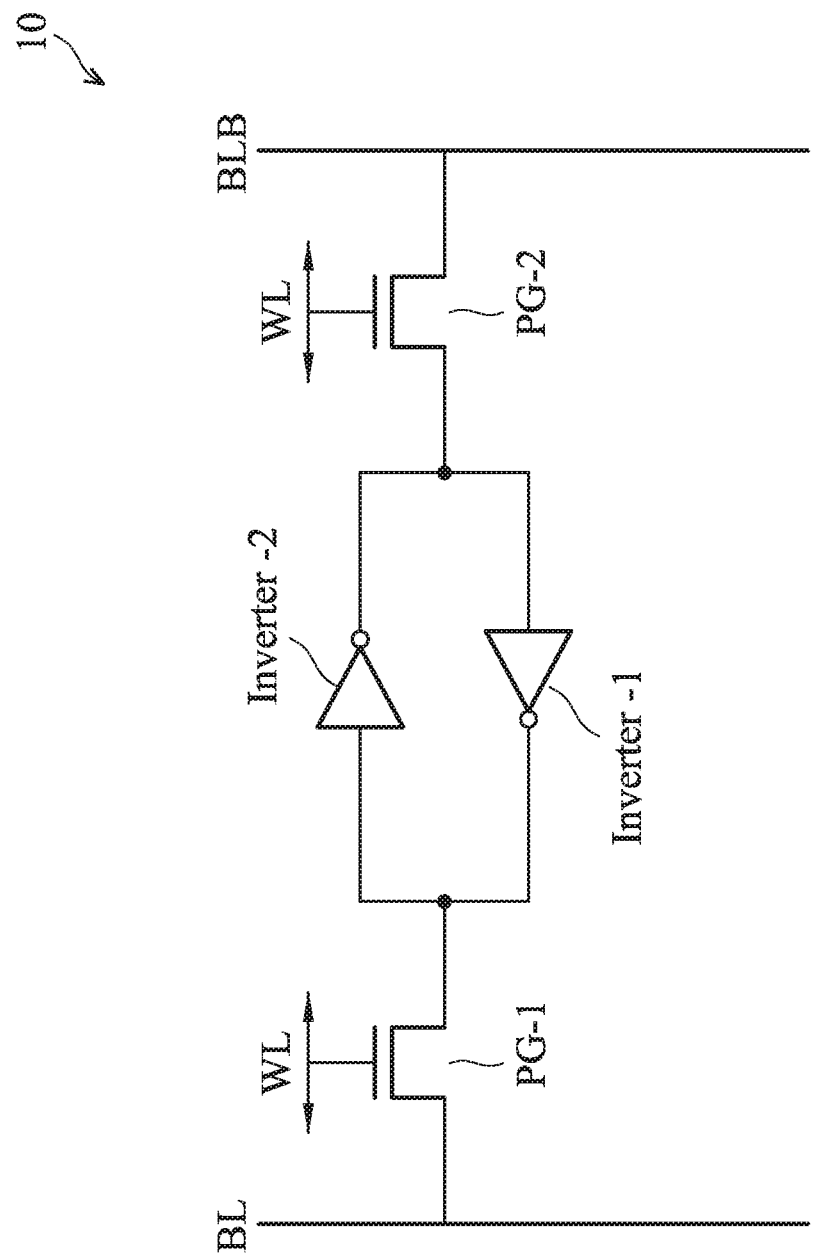

FIG. 2 illustrates an alternative circuit diagram of SRAM cell 10, wherein transistors PU-1 and PD-1 in FIG. 1 are represented as first inverter Inverter-1, and transistors PU-2 and PD-2 are represented as second inverter Inverter-2. The output of first inverter Inverter-1 is connected to transistor PG-1 and the input of the second inverter Inverter-2. The output of second inverter Inverter-2 is connected to transistor PG-2 and the input of second inverter Inverter-2.

Figure 3:
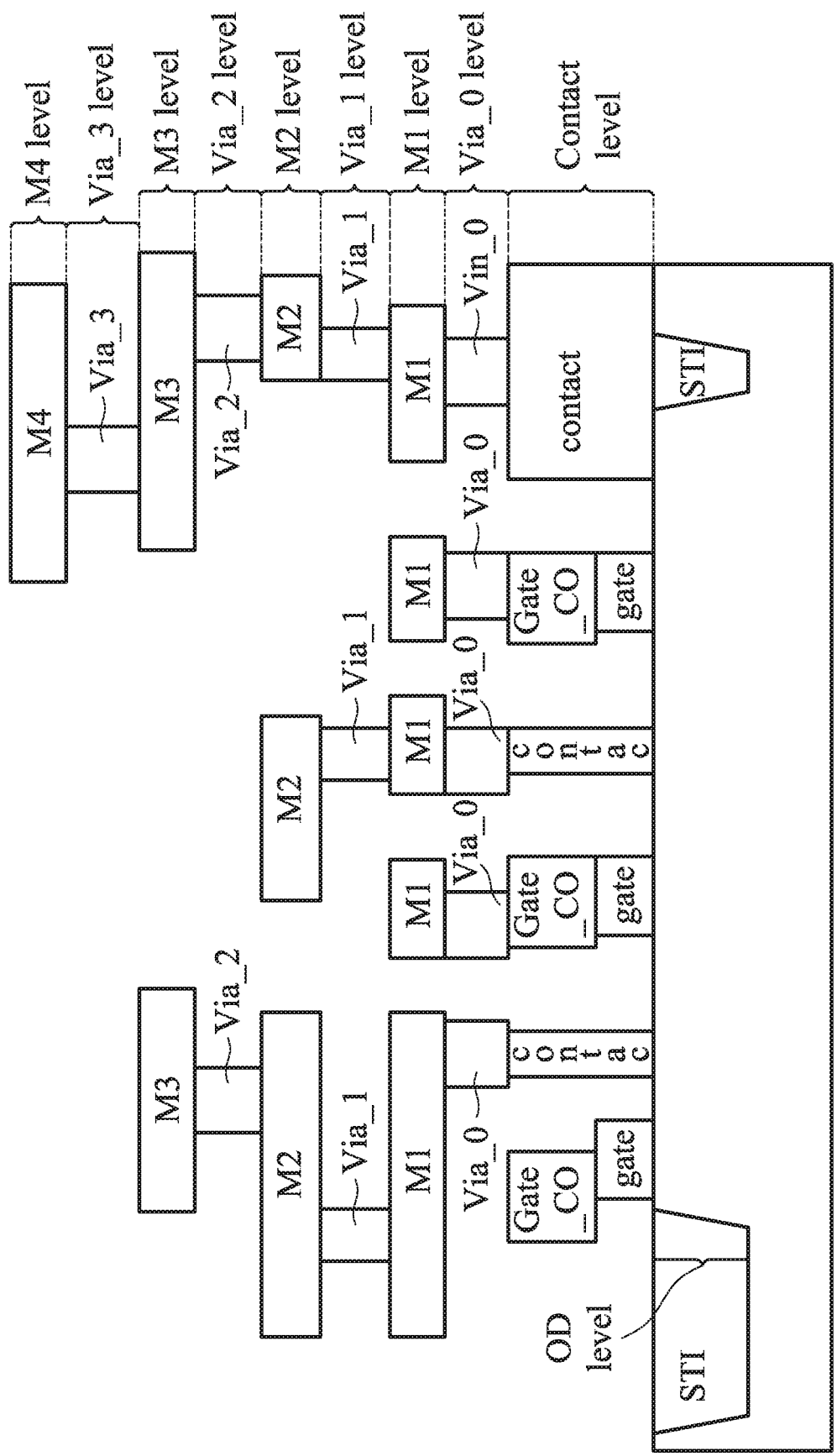
FIG. 3 illustrates a cross-sectional view of the layers involved in an SRAM cell in accordance with some embodiments.

FIG. 3 illustrates a schematic cross-sectional view of a plurality of layers involved in SRAM cell 10, which layers are formed on a semiconductor chip or wafer. It is noted that FIG. 3 is schematically illustrated to show various levels of interconnect structure and transistors, and may not reflect the actual cross-sectional view of SRAM cell 10. The interconnect structure includes a contact level, an OD (wherein the term "OD" represents "active region") level, via levels Via_0 level, Via_1 level, Via_2 level, and Via_3 level, and metal-layer levels M1 level, M2 level, M3 level, and M4 level. Each of the illustrated levels includes one or more dielectric layers and the conductive features formed therein. The conductive features that are at the same level may have top surfaces substantially level to each other, bottom surfaces substantially level to each other, and may be formed simultaneously. The contact level may include gate contacts (also referred to as contact plugs) for connecting gate electrodes of transistors (such as the illustrated exemplary transistors PU-1 and PU-2) to an overlying level such as the Via_0 level, and source/drain contacts (marked as "contact") for connecting the source/drain regions of transistors to the overlying level.

Figure 4:
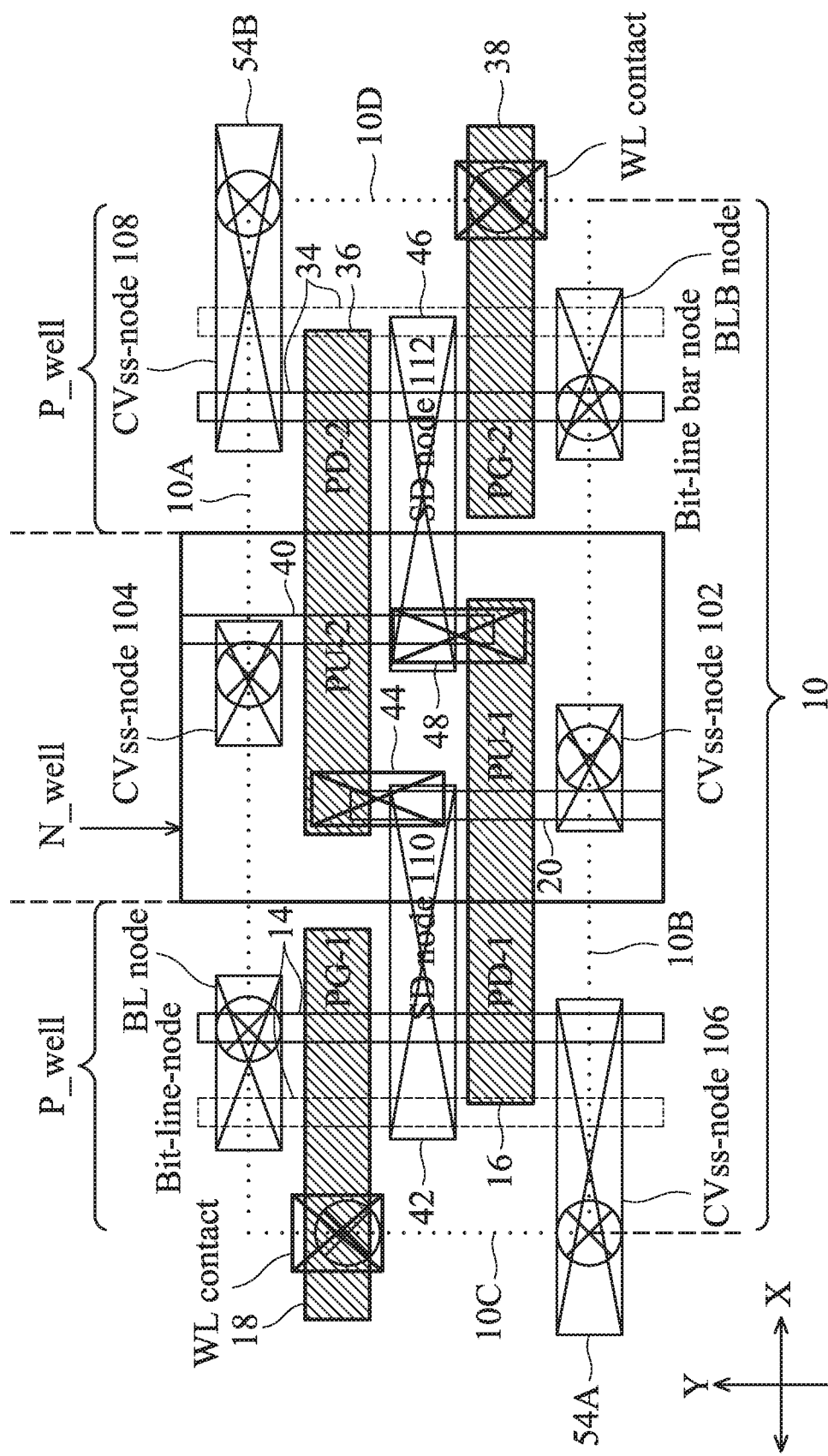
FIG. 4 illustrates a layout of front-end features of a SRAM cell in accordance with embodiments.

FIG. 4 illustrates a layout of the front-end features of SRAM cell 10 in accordance with exemplary embodiments, wherein the front-end features includes the features in the Via_0 level (FIG. 1) and the levels underlying the Via_0 level. The outer boundaries 10A, 10B, 10C, and 10D of SRAM cell 10 are illustrated using dashed lines, which mark a rectangular region. An N_well region is at the middle of SRAM cell 10, and two P_well regions are on opposite sides of the N_Well region. CVdd node 102, CVdd node 104, CVss node 106, CVss node 108, the bit-line (BL) node, and the bit-line bar (BLB) node, which are shown in FIG. 1, are also illustrated in FIG. 4. Gate electrode 16 forms pull-up transistor PU-1 with the underlying active region (in the N_well region) 20, which may be fin-based, and hence are referred to fin 20 hereinafter. Gate electrode 16 further forms pull-down transistor PD-1 with the underlying active regions (in the first P_well region on the left side of the N_well region) 14, which may be fin-based. Gate electrode 18 forms pass-gate transistor PG-1 with the underlying active region 14. Gate electrode 36 forms pull-up transistor PU-2 with the underlying active region (in the N_well region) 40. Gate electrode 36 further forms pull-down transistor PD-2 with the underlying active region (in the second P_well region on the right side of the N_well region) 34. Gate electrode 38 forms pass-gate transistor PG-2 with the underlying active region 34. In accordance with some embodiments of the present disclosure, pass-gate transistors PG-1 and PG-2, pull-up transistors PU-1 and PU-2, and pull-down transistors PD-1 and PD-2 are Fin Field-Effect Transistors (FinFETs). In accordance with alternative embodiments of the present disclosure, pass-gate transistors PG-1 and PG-2, pull-up transistors PU-1 and PU-2, and pull-down transistors PD-1 and PD-2 are planar MOS devices.

FIG. 4 illustrates two fins 14 (and two fins 34) in accordance with some embodiments. In accordance with other embodiments, there may be a single fin, two fins, or three fins, wherein one of the fins 14 (and one of fins 34) is illustrated as dotted to indicate the additional fins that may or may not exist.

As shown in FIG. 4, SD node 110 includes source/drain contact plug 42 and gate contact plug 44, which are the features at the contact level (FIG. 2). Contact plug 42 is elongated and has a longitudinal direction in the X direction, which is parallel to the extending directions of gate electrodes 16 and 36. Gate contact plug 44 comprises a portion over, and is electrically connected to, gate electrode 36. In accordance with some embodiments of the present disclosure, gate contact plug 44 has a longitudinal direction in the Y direction, with is perpendicular to the X direction. In the manufacturing of the SRAM cell 10 on physical semiconductor wafers, contact plugs 42 and 44 may be formed as a single continuous butted contact plug.

SD node 112 includes source/drain contact plug 46 and gate contact plug 48. Gate contact plug 48 has a portion overlapping source/drain contact plug 46. Since SD node 110 may be symmetric to SD node 112, the details of gate contact plug 48 and source/drain contact plug 46 are not repeated herein, and may be found referring to the discussion of gate contact plug 44 and source/drain contact plug 42, respectively.

FIG. 4 also illustrates word line contacts (marked as WL contacts) connected to gate electrodes 18 and 38. Furthermore, a plurality of vias, each illustrated using a circle and a "x" sign in the circle, is over and contacting the respective underlying contact plugs. Elongated contact plugs 54A and 54B are used to connect to the source regions of pull-down transistors PD-1 and PD-2, respectively, to CVss lines. Elongated contact plugs 54A and 54B are parts of the CVss-nodes 106 and 108, respectively. Elongated contact plugs 54A and 54B have lengthwise directions parallel to the X direction, and may be formed to overlap the corners of SRAM cell 10. Furthermore, elongated contact plugs 54A and 54B may further extend into neighboring SRAM cells that abut SRAM cell 10.

Figure 5:
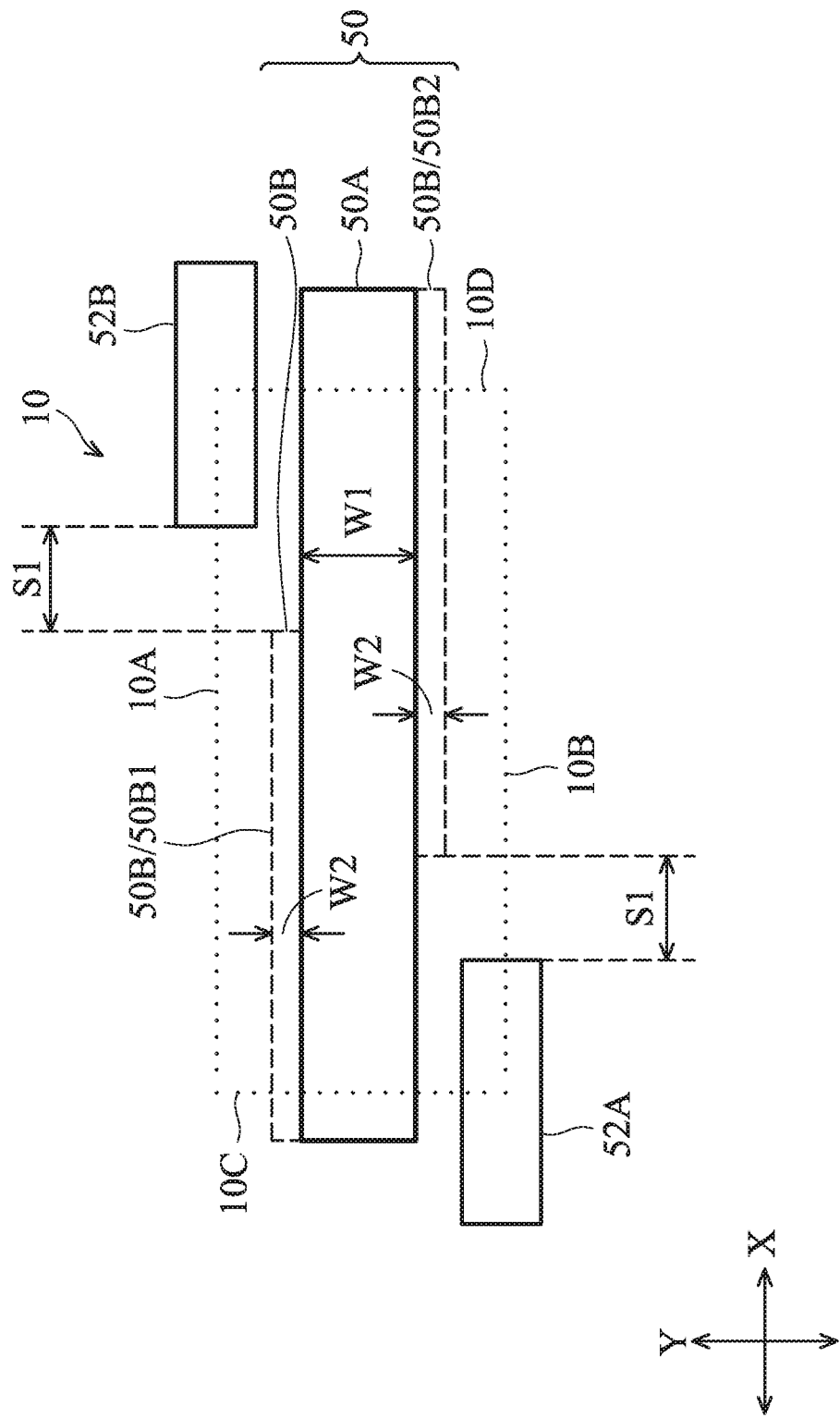
FIG. 5 illustrates a word-line and CVss landing islands in an SRAM cell in accordance with some embodiments.

FIG. 5 illustrates the conductive features in the M2 level (FIG. 1), wherein the conductive features include those inside or adjacent to SRAM cell 10. For the sake of clarity, the front-end features as shown in FIG. 4 are not illustrated in FIG. 5, while the front-end features still exist. SRAM cell 10 includes cell boundaries 10A and 10B parallel to each other and extending in the X direction, and cell boundaries 10C and 10D parallel to reach other and extending in the Y direction. Word-line 50 (including portions 50A and 50B) includes strip portion 50A extending in the X direction. Strip portion 50A extends from boundary 10A all the way to boundary 10B. Strip portion 50A has a rectangular shape. The opposite edges of strip portion 50A are parallel to each other and extending in the X direction.

In accordance with some embodiments of the present disclosure, word-line 50 further includes a single jog portion 50B on one side of strip portion 50A, or two jog portions 50B on the opposite sides of strip portion 50A. The formation of jog portion 50B results in the advantageously increase in the widths of word-line 50, and hence the resistance of word-line 50 is reduced, resulting in an advantageous reduction of RC delay in word-line 50. In accordance with alternative embodiments, word-line 50 includes strip portion 50A and does not include jog portions 50B. Accordingly, jog portions 50B are illustrated using dashed lines to indicate they may or may not exist.

Figure 6:
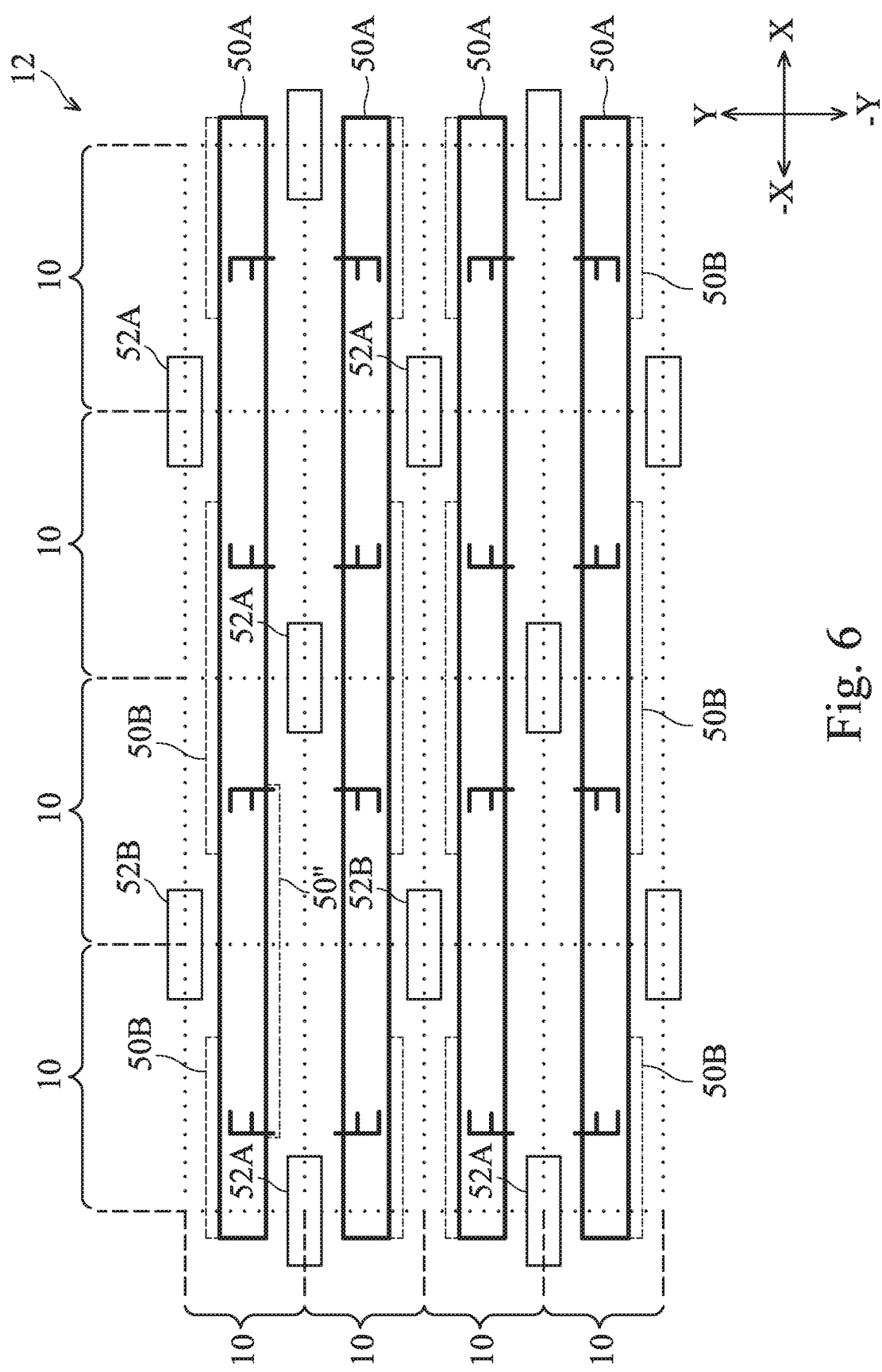
FIG. 6 illustrates word-lines and CVss landing islands in an SRAM array in accordance with some embodiments.

CVss landing pads 52A and 52B, which are in combination referred to as CVss landing pads 52, are also formed in the M2 level. Throughout the description, the term "landing pads" refer to conductive features that are large enough for their overlying vias (Via_2 level vias in this case) to land over. In accordance with some embodiments of the present disclosure, CVss landing pads 52A and 52B are isolated islands in the top view of SRAM cell 10, and may have rectangular shapes. The lengths of CVss landing pads 52A and 52B are much shorter than the length of word-line 50. For example, CVss landing pads 52A and 52B are short enough, so that each CVss landing pad 52A and 52B extends into, and terminates in, two neighboring columns of SRAM cells. As shown in FIG. 6, each of landing pads 52A and 52B extends into four neighboring SRAM cells. As a comparison, word-line 50 may extend into 4 columns, 8 columns, 16 columns, 32 columns (or more) of SRAM cells.

In conventional SRAM structures, Vss lines were formed as long lines parallel to the word-lines, and may have the same length as the word-lines. This results in large parasitic capacitance in the word-lines. In the embodiments of the present disclosure, since CVss landing pads 52 are much shorter than the neighboring word-lines 50, the parasitic capacitance between CVss landing pads 52 and word-line 50 is low. In addition, since CVss landing pads 52 are short, it is possible to form jog portions 50B using the spaces that are freed due to the shortening of CVss lines/pads. In accordance with some exemplary embodiments of the present disclosure, width W2 of jog portions 50B to width W1 of strip portion 50A has ratio W2/W1, which is greater than about 0.1. Ratio W2/W1 may be in the range between about 0.1 and about 0.5.

As shown in FIG. 5, jog portion 50B1, which is one of jog portions 50B, extends toward boundary 10A of SRAM cell, and is still spaced apart from boundary 10A. Jog portion 50B1 further extends from boundary 10C toward CVss landing pad 52B. CVss landing pad 52B also extends from boundary 10D toward jog portion 50B1. CVss landing pad 52B and jog portion 50B1, however, are spaced apart (in the X direction) by spacing S1 to leave enough process margin, so that jog portion 50B1 and CVss landing pad 52B do not electrically short to each other. Similarly, jog portion 50B2 extends toward boundary 10B, and is also spaced apart from CVss landing pad 52A by space S1.

FIG. 6 illustrates a portion of SRAM cell array 12, wherein the illustrated portion may be a portion of a larger array. The illustrated portion of the SRAM array includes 4×4 SRAM cells 10. As shown in FIG. 6, jog portion 50B has one end 50B' terminating inside SRAM cell 10, and another end 50B". The other end terminates in a neighboring SRAM cell 10. Strip portions 50A of word-line 50, on the other hand, may be continuous strips extending into a plurality of SRAM cells in a same row. In FIG. 6, letters "F" are used to illustrate the relative directions of the layouts of SRAM cells 10, wherein each letter "F" represents an SRAM cell and its orientation. Letter F is unique in that its features facing four directions (+X, −X, +Y, and −Y) are different, and hence can be used to identify the orientation of SRAM cells. As shown in FIG. 6, neighboring SRAM columns may mirror each other, and neighboring SRAM rows may mirror each other.

Figure 7:
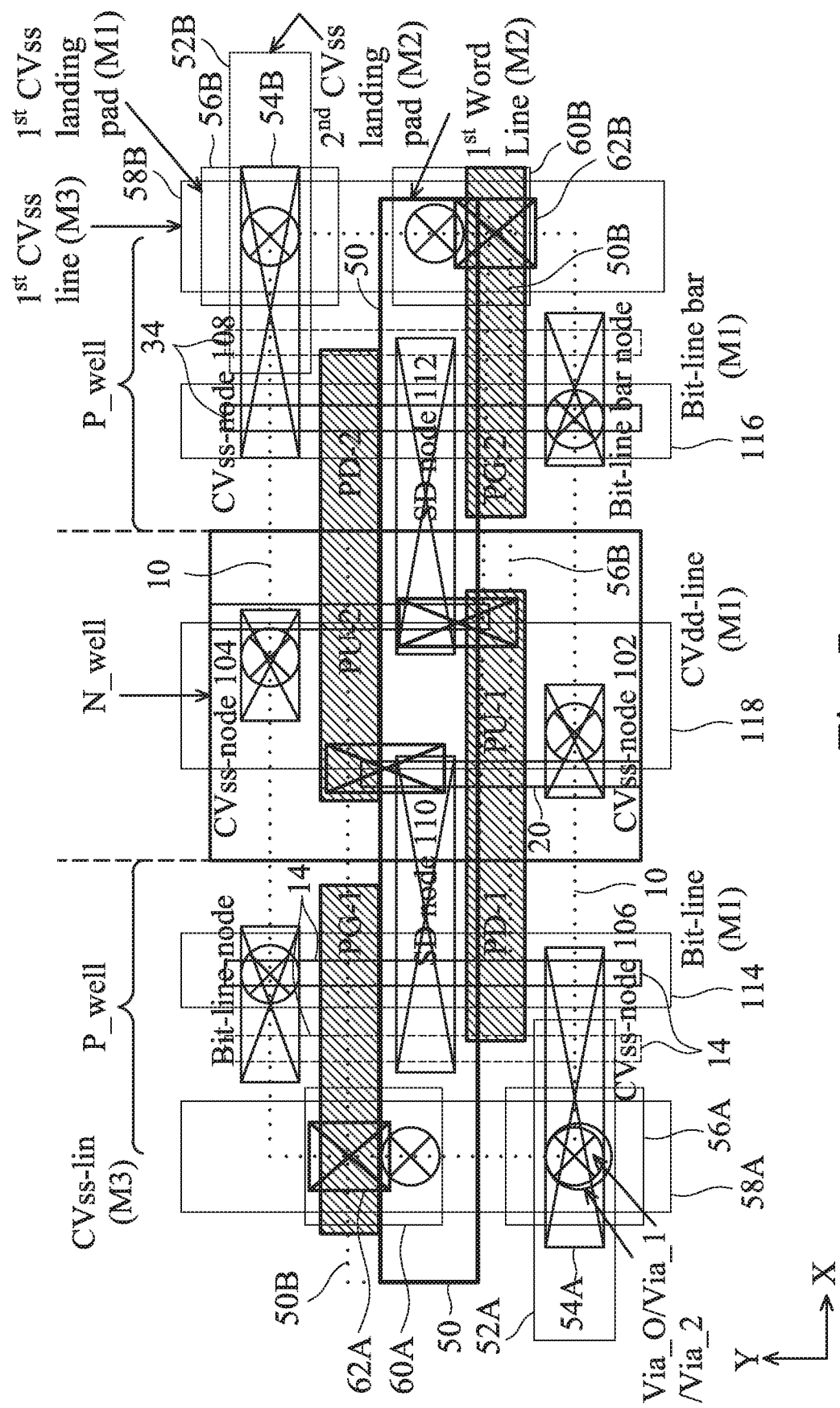
FIG. 7 illustrates a layout of an SRAM cell in accordance with embodiments.

FIG. 7 illustrates the layout of SRAM cell 10 in accordance with some embodiments of the present disclosure. The structure shown in FIG. 5 and the structure shown in FIG. 6 are combined into FIG. 7. Accordingly, the relative positions of the features shown in FIG. 5 and the features shown in FIG. 6 may be found from FIG. 7. The vias in FIG. 7 are illustrated, but are not separately marked using reference numerals. CVss-node 106 includes contact plug 54A at the contact level (FIG. 1), wherein contact plug 54A is electrically connected to landing pad 56A (at the M1 level) through a via (at Via_0 level) therebetween. Contact plug 54A is also electrically connected to the source region of pull-down transistor PD-1. M1 level landing pad 56A is further electrically connected (through a Via_1 level via) to the overlying M2 level CVss landing pad 52A. M2 level landing pad 52A is further electrically connected (through a Via_2 level via) to CVss line 58A, which is at the M3 level. CVss line 58A extends in the Y direction, and may extend into a plurality of SRAM cells in the same column.

As further shown in FIG. 7, word-line 50, which is at the M2 level (FIG. 1), is electrically coupled to landing pad 60A at the M1 level through a via in the Via_1 level. Landing pad 60A is also electrically connected to gate contact plug 62A through a via at the Via-0 level. Again, the vias at various levels are illustrated, and are not marked individually.

The above-discussed connections are on the left side of SRAM cell 10. Similarly, a plurality of connections including landing pads, vias, and contact plugs are also formed on the right side of SRAM cells, the right-side connections are similar to, and may be symmetric to, the left-side features, and hence are not discussed in detail. The right-side connections have the same numbers as the corresponding left-side connections, except the reference numerals of the right-side connections are ended with letter "B" rather than letter "A."

As shown in FIG. 7, CVdd line 118, bit-line 114, and bit-line bar (BLB) 116 are disposed in the M1 level (FIG. 1), and have lengthwise directions parallel to the Y direction. Accordingly, each of CVdd line 118, bit-line 114, and BLB 116 may extend into, and may be connected to, a plurality of SRAM cells in the same column.

Figure 8:
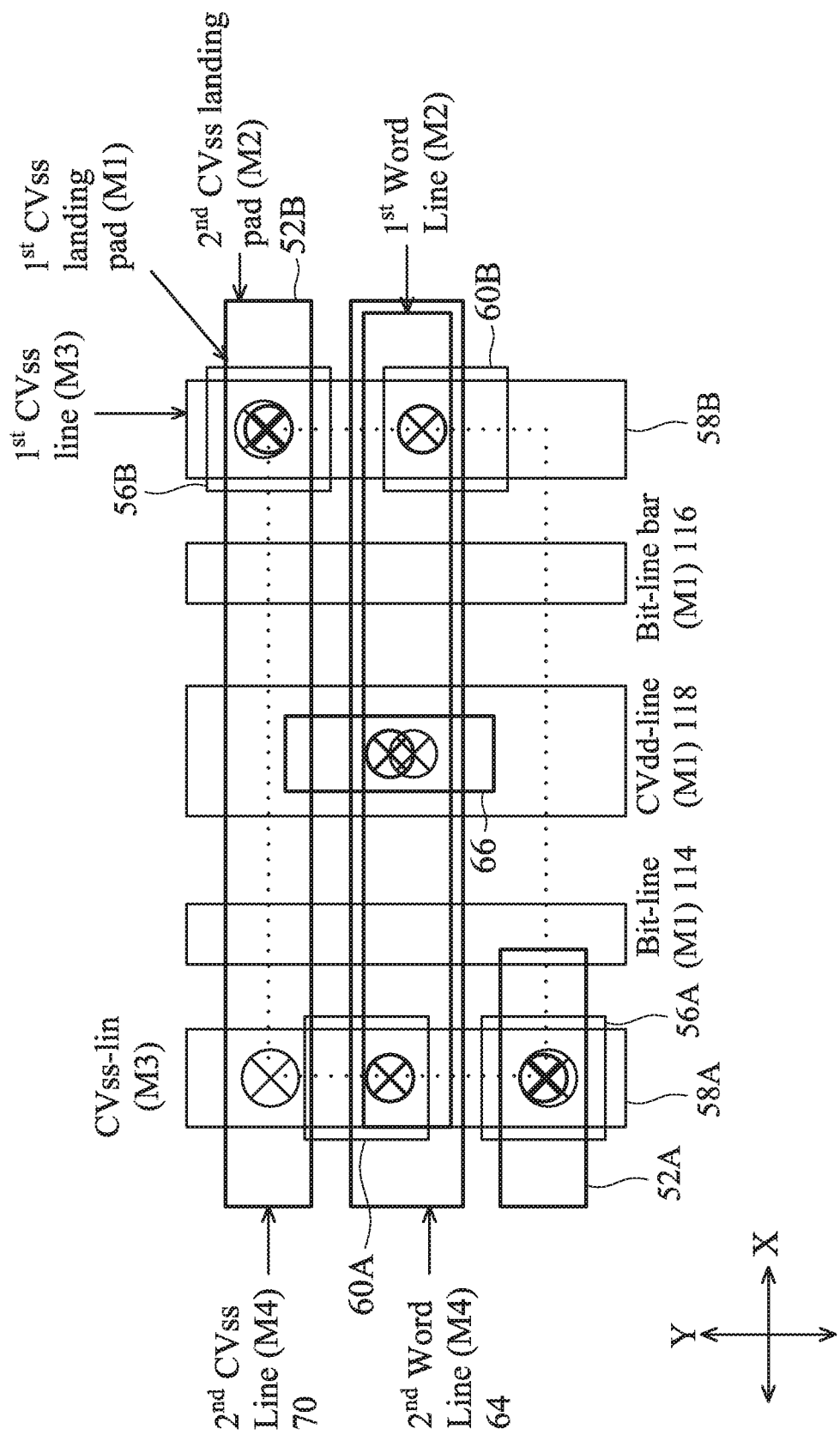
FIG. 8 illustrates double word-lines and double CVss lines in accordance with some embodiments.

As shown in FIG. 7, word-line 50, which is referred to as a first ($1^{st}$) word-line, is in the M2 level. To reduce the resistance of word-lines, a second ($2^{nd}$) word-line 64 is disposed in the M4 level, and extends in the X direction, as illustrated in FIG. 8. Some features shown in FIG. 7 are not illustrated in FIG. 8 for clarity reasons, while these features still exist. FIG. 8 illustrates the double word-line and the double CVss line/pad in accordance with some embodiments of the present disclosure. Word-line 64 may also be formed as a continuous metal line extending into a plurality of SRAM cells in the same row. Word-line 64 may overlap a portion of the underlying word-line 50, so that it is convenient to form interconnections. For example, a M3 level landing pad 66 is connected to the overlying word-line 64 through a via_3 level via, and connected to the underlying word-line 50 through a Via_2 level via. Accordingly, word-lines 50 and 64 are interconnected to form a double word-line structure, and hence the resistance of the resulting double word-line structure is reduced compared to single-word line structure. In accordance with some embodiments of the present disclosure, as shown in FIG. 8, there is one (or more) double-word-line interconnection (including landing pad 66 and an overlying via and an underlying via) per SRAM cell. In accordance with alternative embodiments, there is one double-word-line interconnection shared by a plurality of SRAM cells in a same row. For example, a double-word-line interconnection may be formed every four SRAM cells, every eight SRAM cells, etc. in the same row.

FIG. 8 also illustrates CVss line 70 in the M4 level, wherein CVss line 70 (referred to as a $2^{nd}$ CVss line) is parallel to $2^{nd}$ word-line 64. CVss line 70 is formed at the boundary of SRAM cell 10, and may be shared by neighboring rows of SRAM cells. The $2^{nd}$ CVss line 70 has a lengthwise direction parallel to the X direction. Furthermore, there exist M3 level CVss lines 58 (including 58A and 58B, referred to as $1^{st}$ CVss lines), which extend in the Y direction. CVss lines 58 and 70 are interconnected through the vias in the Via_3 level to form a double CVss line structure, so that the resistance of the CVss lines is also reduced. In the top view of the respective SRAM array, CVss lines 58 and 70 form a mesh structure. The CVss mesh is connected to CVss landing pads 52A and 52B.

Figure 9:
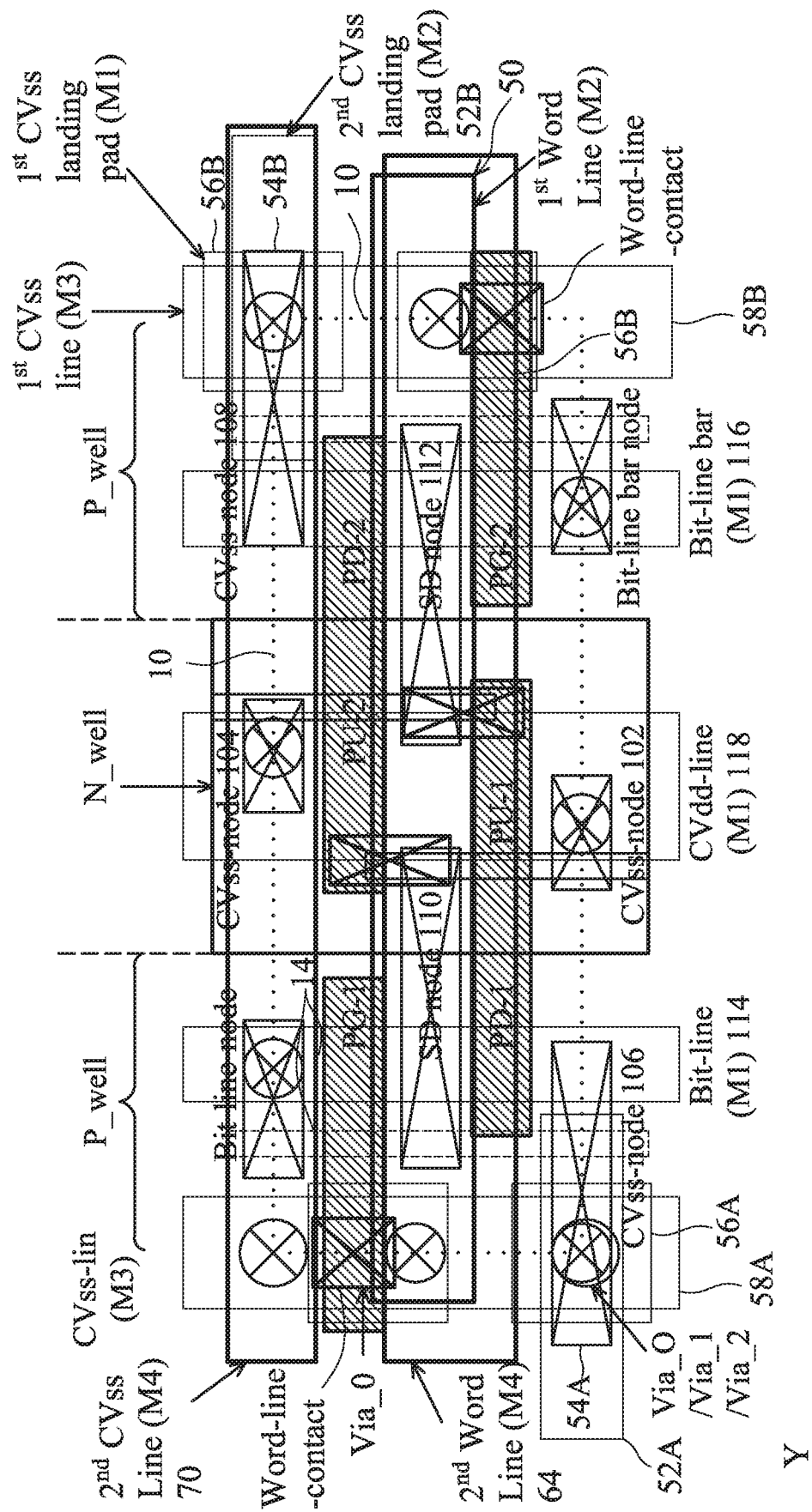
FIG. 9 illustrates the layout of an SRAM cell including double word-lines and double CVss lines in accordance with some embodiments.

FIG. 9 illustrates a layout that combines the front-end structure in FIG. 7 with the structure in FIG. 8. The word-line jog portions are not shown in FIG. 8 for clarity, while the jog portions may or may not be formed. Furthermore, a single fin is shown for each of the transistors, while multi-fin transistors are also contemplated.

Figure 10:
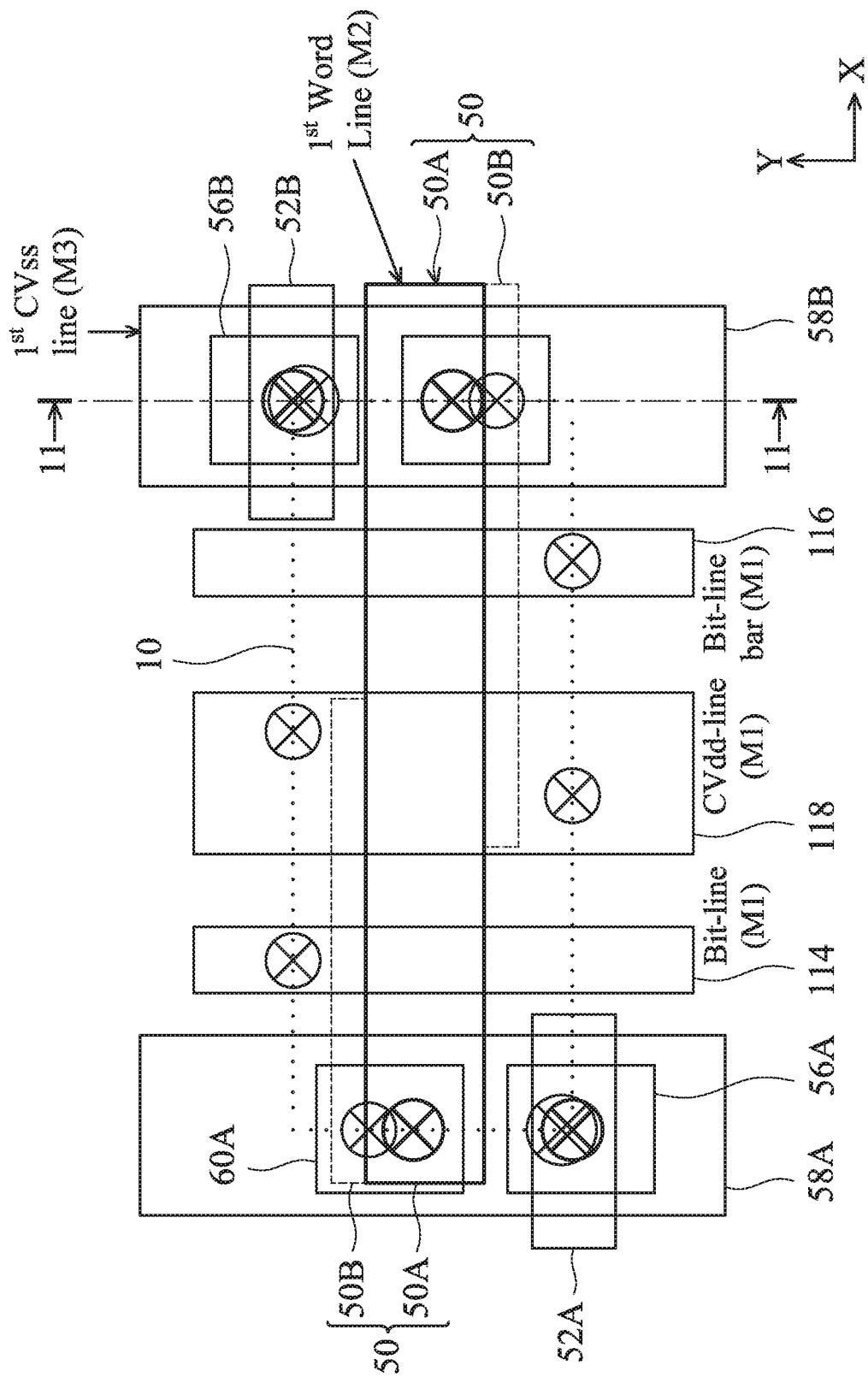
FIG. 10 illustrates the features in metal layers M1 through M3 of an SRAM cell in accordance with some embodiments.

FIG. 10 illustrates some features shown in FIG. 9. The illustrated features include the features in the M1 level, M3 level, and the features therebetween, while other features including the front-end features and the vias in the Via-0 level are not illustrated for clarity purpose. For example, the M1, M2, and M3 level features are illustrated. The M1 features include CVdd line 118, bit-line 114, and bit-line bar 116. The M2 level features include word-line 50 (including strip portion 50A and jog portions 50B (not shown)), and CVss landing pads 52A and 52B. The M3 features include CVss lines 58A and 58B.

Figure 11:
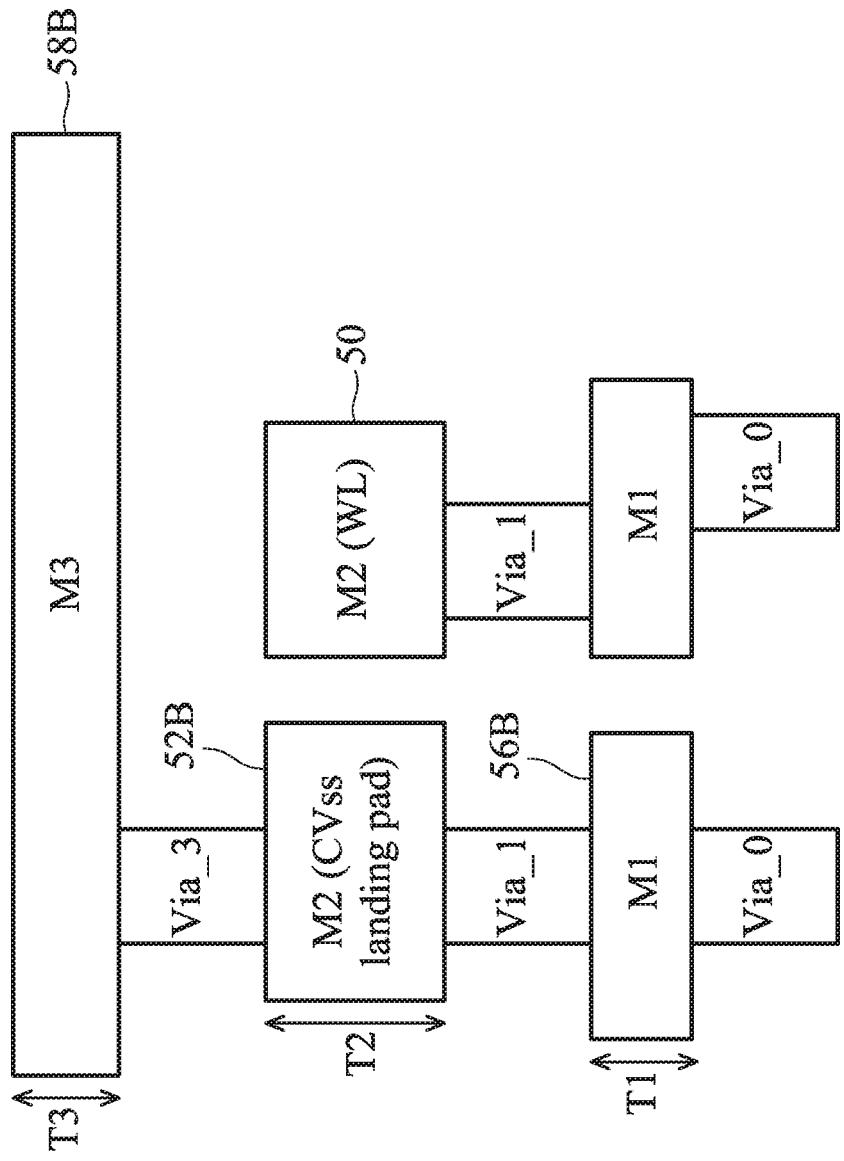
FIG. 11 illustrates a cross-sectional view of the features in metal layers M1 through M3 of an SRAM cell in accordance with some embodiments.

FIG. 11 schematically illustrates a cross-sectional view of the structure in FIG. 10, wherein the cross-sectional view is taken from the plane containing line 11-11 in FIG. 10. In accordance with some embodiments of the present disclosure, the M1 level metal features such as landing pad 56B have thickness T1, the M2 level metal features such as CVss landing pad 52B and word-line 50 have thickness T2, the M3 level metal features such as the 2nd CVss line 58B has thickness T3. In accordance with some embodiments of the present disclosure, thickness T2 is greater than thicknesses T1 and T3. For example, thickness T2 may be greater than both thicknesses T1 and T3 by 30 percent, or by a difference between about 30 percent and about 100 percent. Alternatively stated, each of ratios T2/T1 and T2/T3 may be greater than about 1.3, or between about 1.3 and about 2.0. In accordance with alternative embodiments, thickness T2 is equal to or greater than thickness T1, and thickness T3 is equal to or greater than thickness T2.

Word-lines 50 are long, especially in large SRAM arrays. Accordingly, the resistance of word-lines 50 significantly affects the performance of the large SRAM cell arrays. Since word-lines 50 is in the M2 level, whose thickness was typically small in conventional structures, the word-line performance may become a bottle neck in the improvement of the performance of the SRAM cells array. Making word-line 50 to be thick thus may result in the advantageous reduction of the sheet resistance of word-lines. Accordingly, the speed of the resulting SRAM cells may be improved by increasing the thicknesses of the word-lines 50. On the other hand, the resistance of the bit-lines may be reduced by arranging bit-lines in the M3 level and the M4 level, which are typically thick.

The embodiments of the present disclosure have some advantageous features. By forming CVss landing pads 52A and 52B, which are short and isolated (rather than being long metal lines), the parasitic capacitance between the CVss landing pads and the word-lines is reduced. Furthermore, breaking CVss lines in the M2 level into short landing pads makes it possible to form word-line jogs, and hence the resistance of the word-lines is reduced. With both parasitic resistance and resistance being reduced, the RC delay of the word-lines is reduced, and the speed of the resulting SRAM cell is improved. The reduction in the resistance of the word-lines may also be achieved by forming double word-lines (in both M2 level and M4 level), and by increasing the thickness of the M2 level features.

In accordance with some embodiments of the present disclosure, an integrated circuit structure includes an SRAM) cell, which includes a first pull-up MOS device and a second pull-up MOS device, and a first pull-down MOS device and a second pull-down MOS device forming cross-latched inverters with the first pull-up MOS device and the second pull-up MOS device. The integrated circuit structure further includes an elongated contact over and electrically coupled to a source of the first pull-down MOS device, and a first metal layer, with a bit-line and a CVdd line in the first metal layer. A CVss landing pad overlaps and is electrically coupled to the elongated contact. The CVss landing pad has a portion in the SRAM cell, with the portion having a first length and a first width smaller than a second length and a second width of the SRAM cell. A word-line has a first lengthwise direction, wherein the word-line and the CVss landing pad are in a second metal layer over the first metal layer. A CVss line is in a third metal layer over the second metal layer. The CVss line is electrically coupled to the CVss landing pad, and the CVss line has a second lengthwise direction perpendicular to the first lengthwise direction.

In accordance with some embodiments of the present disclosure, an integrated circuit structure includes an SRAM) cell, which includes a first pull-up MOS device and a second pull-up MOS device, and a first pull-down MOS device and a second pull-down MOS device forming cross-latched inverters with the first pull-up MOS device and the second pull-up MOS device. The integrated circuit structure further includes an elongated contact over and electrically coupled to a source of the first pull-down MOS device, and a first metal layer, with a bit-line and a CVdd line in the first metal layer. A word-line is in a second metal layer over the first metal layer. The word-line includes a strip portion and a jog portion in the SRAM cell. The strip portion has a rectangular top-view shape. The jog portion is connected to a first sidewall of the strip portion, and extends toward the first boundary. The jog portion further extends from the third boundary toward the fourth boundary, and is spaced apart from the fourth boundary. A CVss line is in a third metal layer over the second metal layer.

In accordance with some embodiments of the present disclosure, an integrated circuit structure includes an SRAM) cell, which includes a first pull-up MOS device and a second pull-up MOS device, and a first pull-down MOS device and a second pull-down MOS device forming cross-latched inverters with the first pull-up MOS device and the second pull-up MOS device. The integrated circuit structure further includes an elongated contact over and electrically coupled to a source of the first pull-down MOS device, and a first metal layer, with a bit-line and a CVdd line in the first metal layer. A word-line extends from the third boundary to the fourth boundary. The word-line is in a second metal layer over the first metal layer. A CVss line is in a third metal layer over the second metal layer. The second metal layer has a thickness greater than a thickness of the first metal layer and a thickness of the third metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit structure comprising:
   a Static Random Access Memory (SRAM) cell comprising:
      a first pull-up Metal-Oxide Semiconductor (MOS) device and a second pull-up MOS device; and
      a first pull-down MOS device and a second pull-down MOS device forming cross-latched inverters with the first pull-up MOS device and the second pull-up MOS device;
   a first CVss landing pad electrically coupling to a source of the first pull-down MOS device, wherein the first CVss landing pad has a portion in the SRAM cell, with the portion having a first length and a first width smaller than a second length and a second width, respectively, of the SRAM cell; and
   a first word-line having a first lengthwise direction, wherein the first word-line extends from a first boundary of the SRAM cell to a second boundary of the SRAM, with the first boundary and the second boundary being parallel to each other, and wherein the first word-line and the first CVss landing pad are in a same metal layer.

2. The integrated circuit structure of claim 1 further comprising a second CVss landing pad in a first metal layer, with the second CVss landing pad having a third length and a third width smaller than the second length and the second width, respectively, of the SRAM cell, wherein the same metal layer is a second metal layer over the first metal layer.

3. The integrated circuit structure of claim 2 further comprising a CVss line in a third metal layer over the second metal layer, with the CVss line electrically connecting to the first CVss landing pad and the second CVss landing pad, wherein the CVss line extends to both of a third boundary and a fourth boundary of the SRAM cell.

4. The integrated circuit structure of claim 1 comprising four SRAM cells joining at a point, with the SRAM cell being one of the four SRAM cells, wherein the first CVss landing pad extends into the four SRAM cells.

5. The integrated circuit structure of claim 1, wherein the first word-line has a third width and a fourth width different from each other, wherein the third width and the fourth width are measured in a direction parallel to the first boundary and the second boundary.

6. The integrated circuit structure of claim 1, wherein the SRAM cell further comprises a third boundary and a fourth boundary parallel to each other and perpendicular to the first boundary and the second boundary, and wherein the first CVss landing pad extends to the first boundary and the fourth boundary, and does not extend to the second boundary and the third boundary.

7. The integrated circuit structure of claim 1, wherein the first word-line comprises:
   a strip portion having a uniform width, with the strip portion extending from the first boundary to the second boundary; and
   a first jog portion on a first side of the strip portion, wherein the first jog portion extends to the first boundary, and is spaced apart from the second boundary.

8. The integrated circuit structure of claim 7 further comprising a second jog portion on a second side of the strip portion, wherein the second jog portion extends to the second boundary, and is spaced apart from the first boundary.

9. The integrated circuit structure of claim 1 further comprising a second word-line in an additional metal layer over the same metal layer, wherein the second word-line is parallel to, and has a portion overlapping a portion of, the first word-line, and the first word-line is electrically coupled to the second word-line.

10. The integrated circuit structure of claim 1, wherein the same metal layer has a first thickness greater than a second thickness of a first additional metal layer immediately over the same metal layer and a third thickness of a second additional metal layer immediately under the same metal layer.

11. An integrated circuit structure comprising:
    a Static Random Access Memory (SRAM) cell having a first boundary and a second boundary parallel to each other, and a third boundary and a fourth boundary parallel to each other, the SRAM cell comprising:
       a first pull-up Metal-Oxide Semiconductor (MOS) device and a second pull-up MOS device; and
       a first pull-down MOS device and a second pull-down MOS device forming cross-latched inverters with the first pull-up MOS device and the second pull-up MOS device; and
    a word-line extending from the first boundary to the second boundary, wherein the word-line comprises:
       a strip portion in the SRAM cell, the strip portion having a rectangular top-view shape, wherein the strip portion extends from the first boundary to the second boundary; and
       a first jog portion joining a first sidewall of the strip portion, wherein the first jog portion extends to the first boundary, and the first jog portion is spaced apart from the second boundary.

12. The integrated circuit structure of claim 11, wherein the first jog portion is spaced apart from both of the third boundary and the fourth boundary.

13. The integrated circuit structure of claim 11, wherein the word-line further comprises a second jog portion joining a second sidewall of the strip portion, with the first sidewall and the second sidewall being opposing to each other, wherein the second jog portion extends to the second boundary, and is spaced apart from the first boundary.

14. The integrated circuit structure of claim 13, wherein the second jog portion is further spaced apart from both of the third boundary and the fourth boundary.

15. The integrated circuit structure of claim 11 further comprising a CVss landing pad in a same metal layer as the word-line, wherein the CVss landing pad extends to the first boundary and the fourth boundary, and is spaced apart from both of the second boundary and the third boundary.

16. The integrated circuit structure of claim 11, wherein the word-line is in a second metal layer, and the integrated circuit structure further comprises a first metal layer underlying the second metal layer.

17. An integrated circuit structure comprising:
a Static Random Access Memory (SRAM) cell having a first boundary and a second boundary parallel to each other, and a third boundary and a fourth boundary parallel to each other, wherein the third boundary and the fourth boundary are perpendicular to the first boundary and the second boundary;
a first CVss landing pad over and electrically coupling to the SRAM cell; and
a second CVss landing pad overlapping and electrically connected to the first CVss landing pad, wherein each of the first CVss landing pad and the second CVss landing pad extends to both of the first boundary and the fourth boundary, and is spaced apart from the second boundary and the third boundary.

18. The integrated circuit structure of claim 17 further comprising;
a first word-line in a same layer as the first CVss landing pad, wherein the first word-line has a uniform width; and
a second word-line in an additional same layer as the second CVss landing pad, wherein the second word-line has a non-uniform width.

19. The integrated circuit structure of claim 18, wherein the second word-line has a portion between the first boundary and the second boundary, wherein the portion of the second word-line comprises:
a middle portion; and
two end portions on opposite sides of the middle portion, wherein the middle portion is wider than the two end portions.

20. The integrated circuit structure of claim 17, wherein the first CVss landing pad is in a first metal layer, and the second CVss landing pad is in a second metal layer immediately over the first metal layer, with no additional metal layer between the first metal layer and the second metal layer.

* * * * *